(12) United States Patent
Kim et al.

(10) Patent No.: US 12,111,528 B2
(45) Date of Patent: Oct. 8, 2024

(54) TILING DISPLAY DEVICE

(71) Applicant: LG Display Co., Ltd., Seoul (KR)

(72) Inventors: JungJae Kim, Goyang-si (KR);
SoonDong Cho, Gumi-si (KR);
JaeWon Han, Goyang-si (KR);
MinGyu Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 198 days.

(21) Appl. No.: 17/377,165

(22) Filed: Jul. 15, 2021

(65) Prior Publication Data

US 2022/0059644 A1    Feb. 24, 2022

(30) Foreign Application Priority Data

Aug. 19, 2020    (KR) .................... 10-2020-0103843

(51) Int. Cl.
*G02F 1/1333* (2006.01)
*H10K 59/18* (2023.01)
*H10K 59/131* (2023.01)

(52) U.S. Cl.
CPC ......... *G02F 1/13336* (2013.01); *H10K 59/18* (2023.02); *H10K 59/131* (2023.02)

(58) Field of Classification Search
None
See application file for complete search history.

(56) References Cited

U.S. PATENT DOCUMENTS

| | | | |
|---|---|---|---|
| 5,105,183 A | 4/1992 | Beckman | |
| 5,867,236 A * | 2/1999 | Babuka | G02F 1/1339 349/73 |
| 7,535,535 B2 * | 5/2009 | Iwabuchi | G02F 1/133351 349/152 |
| 8,446,402 B2 | 5/2013 | Sang et al. | |
| 8,514,162 B2 | 8/2013 | Moh et al. | |
| 11,064,608 B2 | 7/2021 | Choi et al. | |

(Continued)

FOREIGN PATENT DOCUMENTS

| | | |
|---|---|---|
| CN | 101727866 A | 6/2010 |
| CN | 101887699 A | 11/2010 |

(Continued)

OTHER PUBLICATIONS

European Patent Office, Extended Euopean Search Report and Opinion, EP Patent Application No. 21187442.5, Nov. 18, 2021, 14 pages.

(Continued)

*Primary Examiner* — Dung T Nguyen

(74) *Attorney, Agent, or Firm* — Fenwick & West LLP

(57) ABSTRACT

A tiling display device comprises a plurality of display devices, and a main circuit board driving the plurality of display devices. Each of the plurality of display devices includes a display panel that displays an image, a plurality of flexible films bonded to a rear surface of the display panel, and a printed circuit board electrically connected to the plurality of flexible films. A plurality of printed circuit boards of the plurality of display devices are cascaded to each other and the plurality of printed circuit boards have a same shape. Therefore, the efficiency of a manufacturing process of the plurality of printed circuit boards provided in a tiling display device can be improved.

12 Claims, 11 Drawing Sheets

(56) References Cited

U.S. PATENT DOCUMENTS

| | | |
|---|---|---|
| 2003/0090198 A1 | 5/2003 | Aston |
| 2007/0103384 A1 | 5/2007 | Hsieh et al. |
| 2010/0110058 A1 | 5/2010 | Moh et al. |
| 2010/0283777 A1 | 11/2010 | Sang et al. |
| 2013/0265290 A1 | 10/2013 | Lee |
| 2013/0328750 A1 | 12/2013 | Moh et al. |
| 2020/0170114 A1 | 5/2020 | Choi et al. |
| 2020/0243738 A1* | 7/2020 | Feng ................ H01L 33/62 |
| 2020/0271971 A1 | 8/2020 | Su |

FOREIGN PATENT DOCUMENTS

| | | |
|---|---|---|
| CN | 108181752 A | 6/2018 |
| CN | 111243432 A | 6/2020 |
| KR | 10-2019-0057723 A | 5/2019 |

OTHER PUBLICATIONS

China National Intellectual Property Administration, Office Action, Chinese Patent Application No. 202110820298.0, Nov. 21, 2023, 14 pages.

China National Intellectual Property Administration, Notice of Allowance, Chinese Patent Application No. 202110820298.0, Mar. 27, 2024, eight pages.

\* cited by examiner

TILING DISPLAY DEVICE

CROSS-REFERENCE TO RELATED APPLICATIONS

This application claims the benefit of and priority to Korean Patent Application No. 10-2020-0103843 filed on Aug. 19, 2020 in the Republic of Korea, the entire contents of which are hereby expressly incorporated by reference herein.

BACKGROUND

Technical Field

The present disclosure relates to a tiling display device, and more particularly, to a tiling display device including printed circuit boards that are cascaded to each other.

Discussion of the Related Art

Display devices used in computer monitors, TVs, and mobile phones include organic light emitting display (OLED) devices that emit light by themselves, and liquid crystal display (LCD) devices that require a separate light source.

Such display devices are being applied to more and more various fields including not only computer monitors and TVs, but also personal mobile devices, and thus, display devices having a reduced volume and weight while having a wide display area are being studied.

Meanwhile, recently, a tiling display device in which a display area is increased by connecting a plurality of display devices is used as an advertisement board or the like.

SUMMARY

An aspect of the present disclosure is to provide a tiling display device in which printed circuit boards used in common are cascaded.

Another aspect of the present disclosure is to provide a tiling display device capable of reducing a signal deviation of printed circuit boards.

Still another aspect of the present disclosure is to provide a tiling display device allowing for improvements in a yield in a module process.

Objects of the present disclosure are not limited to the above-mentioned objects, and other objects, which are not mentioned above, can be clearly understood by those skilled in the art from the following descriptions.

A tiling display device according to an exemplary embodiment of the present disclosure includes a plurality of display devices, and a main circuit board driving the plurality of display devices. Each of the plurality of display devices includes a display panel that displays an image, a plurality of flexible films bonded to a rear surface of the display panel, and a printed circuit board electrically connected to the plurality of flexible films. A plurality of printed circuit boards included in the plurality of display devices are cascaded to each other. The plurality of printed circuit boards have the same shape, so that the plurality of printed circuit boards can be used in common.

Other detailed matters of the exemplary embodiments are included in the detailed description and the drawings.

According to the present disclosure, by using a plurality of printed circuit boards in common, the efficiency of a manufacturing process of the plurality of printed circuit boards provided in a tiling display device can be improved.

According to the present disclosure, by using a plurality of printed circuit boards in common, the yield of a module assembly process of a tiling display device can also be improved.

According to the present disclosure, noise of an output signal can be remarkably removed by forming a compensation printed circuit on a plurality of printed circuit boards.

The effects according to the present disclosure are not limited to the contents exemplified above, and more various effects are included in the present specification.

DETAILED DESCRIPTION OF THE EMBODIMENTS

Figure 1:
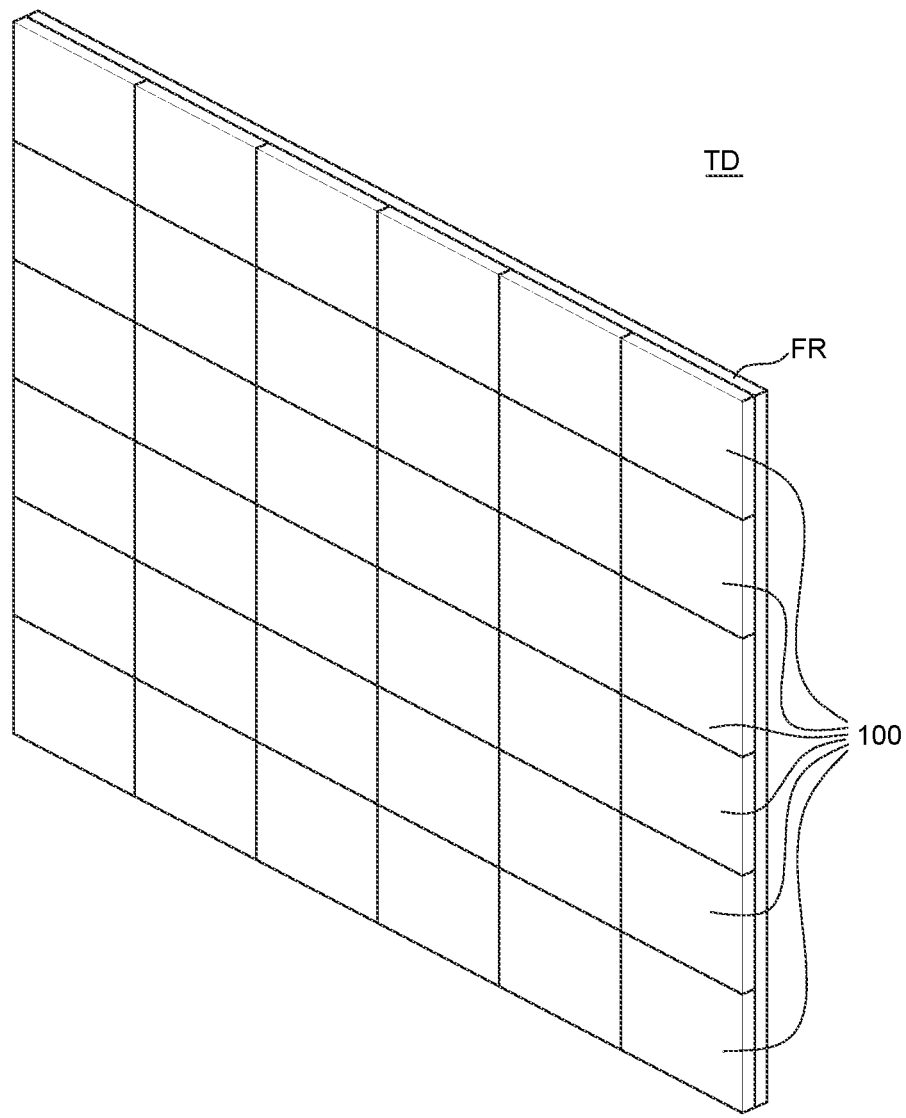
FIG. 1 is a perspective view of a tiling display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consisting" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a perspective view of a tiling display device TD according to an exemplary embodiment of the present disclosure. Referring to FIG. 1, the tiling display device TD according to an exemplary embodiment of the present disclosure is formed by connecting a plurality of display devices 100 according to an exemplary embodiment of the present disclosure.

Referring to FIG. 1, the tiling display device TD according to an exemplary embodiment includes the plurality of display devices 100 and a frame FR. The tiling display device TD may be implemented by disposing the plurality of display devices 100 and may increase a display area in which an image is displayed.

Each of the plurality of display devices 100 is attached to the frame FR and is arranged like a single display device 100. For example, the tiling display device TD may be implemented by attaching the plurality of display devices 100 to the frame FR in a tile form. At this time, although not illustrated in the drawings, various lines and cables for electrically connecting each of the plurality of display devices 100 may be disposed on the frame FR, and the plurality of display devices 100 may be driven like a single display device 100. The plurality of display devices 100 are cascaded to each other. A detailed description will be described later in FIG. 3. The plurality of display devices 100 that are cascaded to each other may be connected to and driven by a main circuit board.

The plurality of display devices 100 may be connected in a wireless communication manner without separate lines or cables. However, also a wired connection might be possible between display devices 100.

When attaching the plurality of display devices 100 to the frame FR, the plurality of display devices 100 may be attached as closely as possible such that intervals between the plurality of display devices 100 are constant and reduced. That is, by closely disposing the plurality of display devices 100 and attaching them to the frame FR, a boundary area in which an image is not displayed may be reduced.

Figure 2:
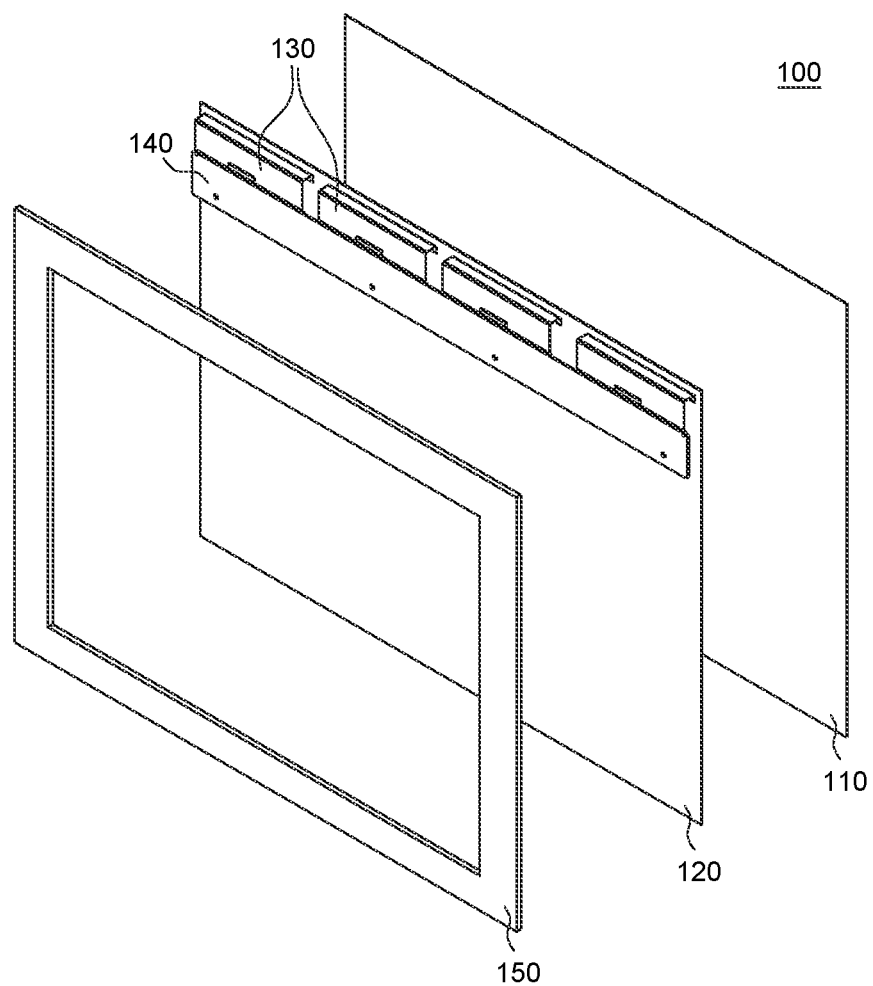
FIG. 2 is an exploded perspective view of a display device according to an exemplary embodiment of the present disclosure.

FIG. 2 is an exploded perspective view of a display device according to an exemplary embodiment of the present disclosure. FIG. 2 is an exploded perspective view of the display device 100 viewed from a rear side.

Referring to FIG. 2, the display device 100 includes a protective plate 110, a display panel 120, a plurality of flexible films 130, a printed circuit board 140, and a binding member 150.

The display panel 120 is a component for displaying an image to a user. In the display panel 120, for example, display elements and circuits, lines, and components for driving the display elements may be disposed. The display element may be defined differently according to a type of the display panel 120. For example, when the display panel 120 is an organic light emitting display panel, the display element may be an organic light emitting element including an anode, an organic light emitting layer, and a cathode. For example, when the display panel 120 is an inorganic light emitting display panel, the display element may be a light emitting diode (LED) or micro-LED including an n-type semiconductor layer, a p-type semiconductor layer, and a light emitting layer. However, the present disclosure is not limited thereto, and the display elements of the display panel 120 may be variously configured.

A protective plate 110 covering the display panel 120 is disposed in front of the display panel 120. The protective plate 110 may cover the display panel 120 to thereby protect the display panel 120 from external impacts, moisture, heat, and the like. The protective plate 110 may be formed of a material having impact resistance and light transmittance. For example, the protective plate 110 may be a substrate formed of glass, or may be a thin film formed of a plastic material such as polycarbonate (PC), polyimide (PI), polymethylmethacrylate (PMMA) or polyethylene terephthalate (PET), but is not limited thereto.

Meanwhile, in the drawings, it is illustrated that the display device 100 including the display panel 120 and the protective plate 110 is attached to the frame FR to implement the tiling display device TD. However, after completing the tiling display device TD, the protective plate 110 may be detached from the display panel 120 and only the display panel 120 may be attached to the frame FR. That is, the protective plate 110 may be not permanently attached to the display panel 120, but may be temporarily attached to the display panel 120 only during a tiling process to minimize impacts applied to the display panel 120 at the time of tiling. However, the present disclosure is not limited thereto and the protective plate 110 might be permanently attached to the display panel.

The one or more flexible films 130 are bonded to a rear surface of the display panel 120. The flexible film 130 is a film in/on which various components are disposed on a flexible base film to supply signals to the display elements and circuits, and may be electrically connected to the display panel 120. The one or more flexible films 130 may supply a power voltage, a data voltage and the like to the display panel 120. Meanwhile, in FIG. 2, four flexible films 130 are bonded to a long side of the display panel 120, but the number and arrangement of the one or more flexible films 130 may be variously changed according to design and are not limited thereto.

One or more driver ICs such as a gate driver IC and/or a data driver IC may be disposed on the one or more flexible films 130. The driver IC is a component that processes data for displaying an image and generates or provides a driving signal for driving the display panel and for processing the display data. The driver IC may be disposed such as a chip on glass (COG), a chip on film (COF), a tape carrier package (TCP), or the like, depending on a mounting method thereof. For convenience of explanation, it has been described that the driver IC is a chip on film (COF) type mounted on the one or more flexible films 130, but is not limited thereto.

The printed circuit board 140 is electrically connected to the one or more flexible films 130. The printed circuit board 140 is a component that supplies signals to the one or more driver ICs of the flexible films 130. Various components for supplying various signals such as a driving signal, a data signal and the like to the driver IC may be disposed on the printed circuit board 140. For example, a plurality of printed lines for transmitting various signals such as a driving signal, a data signal and the like may be formed on the printed circuit board 140. In addition, a printed circuit for controlling and compensating various signals such as a driving signal, a data signal and the like may be formed on the printed circuit board 140.

Meanwhile, in FIG. 2, although one printed circuit board 140 is illustrated, the number of printed circuit boards 140 may be variously changed according to design, and is not limited thereto.

The binding member 150 is disposed on the rear surface of the display panel 120. The binding member 150 may support and protect the display panel 120, on the rear surface of the display panel 120. The binding member 150 may be formed of a material having rigidity, for example, may be formed of a metallic material such as aluminum (Al), copper (Cu), zinc (Zn), silver (Ag), gold (Au), iron (Fe), steel use stainless (SUS) or Invar, or plastic.

The binding member 150 may have a shape corresponding to an edge of the display panel 120. For example, the binding member 150 may have a frame shape corresponding to the edge of the display panel 120. The binding member 150 may support the edge of the display panel 120 so that the display panel 120 remains flat. However, the binding member 150 may be formed to have the same shape as a planar shape of the display panel 120 instead of a frame shape, and the shape of the binding member 150 is not limited thereto as long as it can support the display panel 120.

Meanwhile, a cover shield may be further disposed on the rear surface of the binding member 150. The cover shield may cover the binding member 150, the one or more flexible films 130, and the printed circuit board 140 on the rear surface of the binding member 150. Specifically, the one or more flexible films 130 are bonded to the rear surface of the display panel 120. In this case, the one or more flexible films 130 and the printed circuit board 140 may not be disposed between the display panel 120 and the binding member 150, but may be disposed to cover the binding member 150. Since the one or more flexible films 130 are films in/on which various components are disposed on base films having softness, they can be easily bent. Thus, the one or more flexible films 130 are disposed to cover the binding member 150 so that the one or more flexible films 130 and the printed circuit board 140 are formed on the rear surfaces of the display panel 120 and the binding member 150.

In this case, since the binding member 150 does not cover the one or more flexible films 130 and the printed circuit board 140, it may be difficult to protect the one or more flexible films 130 and the printed circuit board 140 from external impacts. Accordingly, in order to protect the one or more flexible films 130 and the printed circuit board 140, a cover shield may be further disposed on the rear surface of the binding member 150. The cover shield is disposed to cover the one or more flexible films 130, the printed circuit board 140 and the binding member 150, and may protect other components of the display device 100, in particular, the one or more flexible films 130, and the printed circuit board 140.

Hereinafter, a connection relationship of the tiling display device according to an exemplary embodiment of the present disclosure will be described in detail with reference to FIG. 3.

Figure 3:
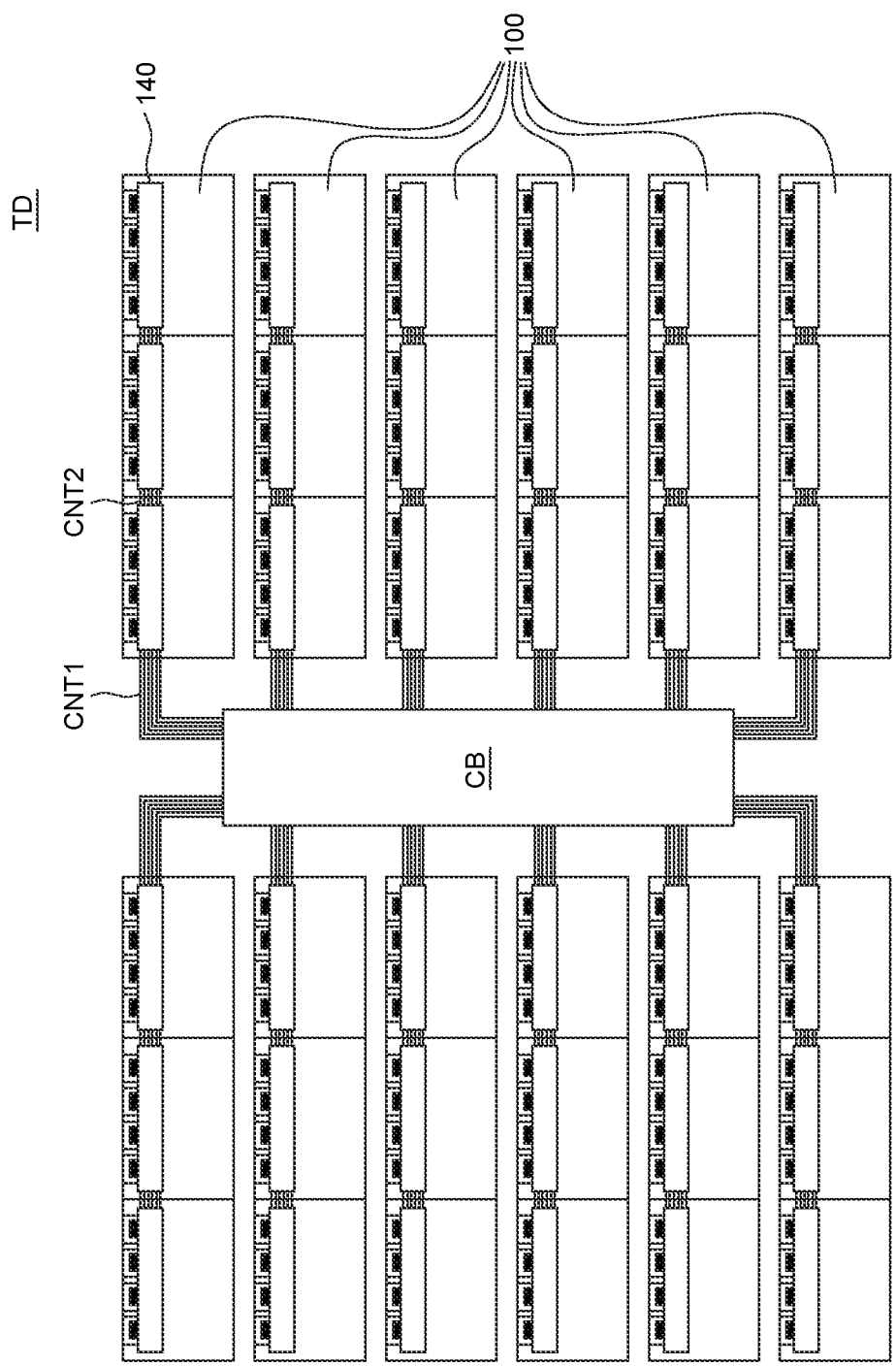
FIG. 3 is a rear view of the tiling display device according to an exemplary embodiment of the present disclosure.

FIG. 3 is a rear view of the tiling display device TD according to an exemplary embodiment of the present disclosure.

As illustrated in FIG. 3, the plurality of display devices 100 are cascaded to each other, and the plurality of cascaded display devices 100 are connected to a main circuit board CB. Specifically, the printed circuit boards 140 of the plurality of respective display devices 100 are cascaded to each other by second connection lines CNT2. Among the plurality of printed circuit boards 140 cascaded to each other, the printed circuit boards 140 that are closest to the main circuit board CB are electrically connected to the main circuit board CB by a first connection line CNT1. Accordingly, all of the display devices 100 are electrically connected to the main circuit board CB. Thus, the main circuit board CB may drive all the display devices 100 as if they were one display device 100.

A timing controller (not shown) and/or a power supply (not shown) may be disposed on the main circuit board CB.

The timing controller receives timing signals such as a vertical synchronization signal, a horizontal synchronization signal, a data enable signal, and a dot clock through a reception circuit such as an LVDS (Low Voltage Differential Signaling) or TMDS (Transition Minimized Differential Signaling) interface connected to a host system. The timing controller generates various signals, such as a driving signal and a data signal, which are timing control signals for controlling the driver IC such as a gate driver IC (not shown) and a data driver IC (not shown) based on the timing signal input thereto.

The power supply may supply a driving voltage to each of the plurality of display devices 100. That is, the power supply may be electrically connected to at least a gate power connection line (not shown), a data power connection line (not shown), and a pixel power connection line (not shown) of each of the plurality of display devices 100. Accordingly, a plurality of power supplies may supply a gate driving voltage, a data driving voltage, and a pixel driving voltage to each of the plurality of display devices 100.

Figure 4:
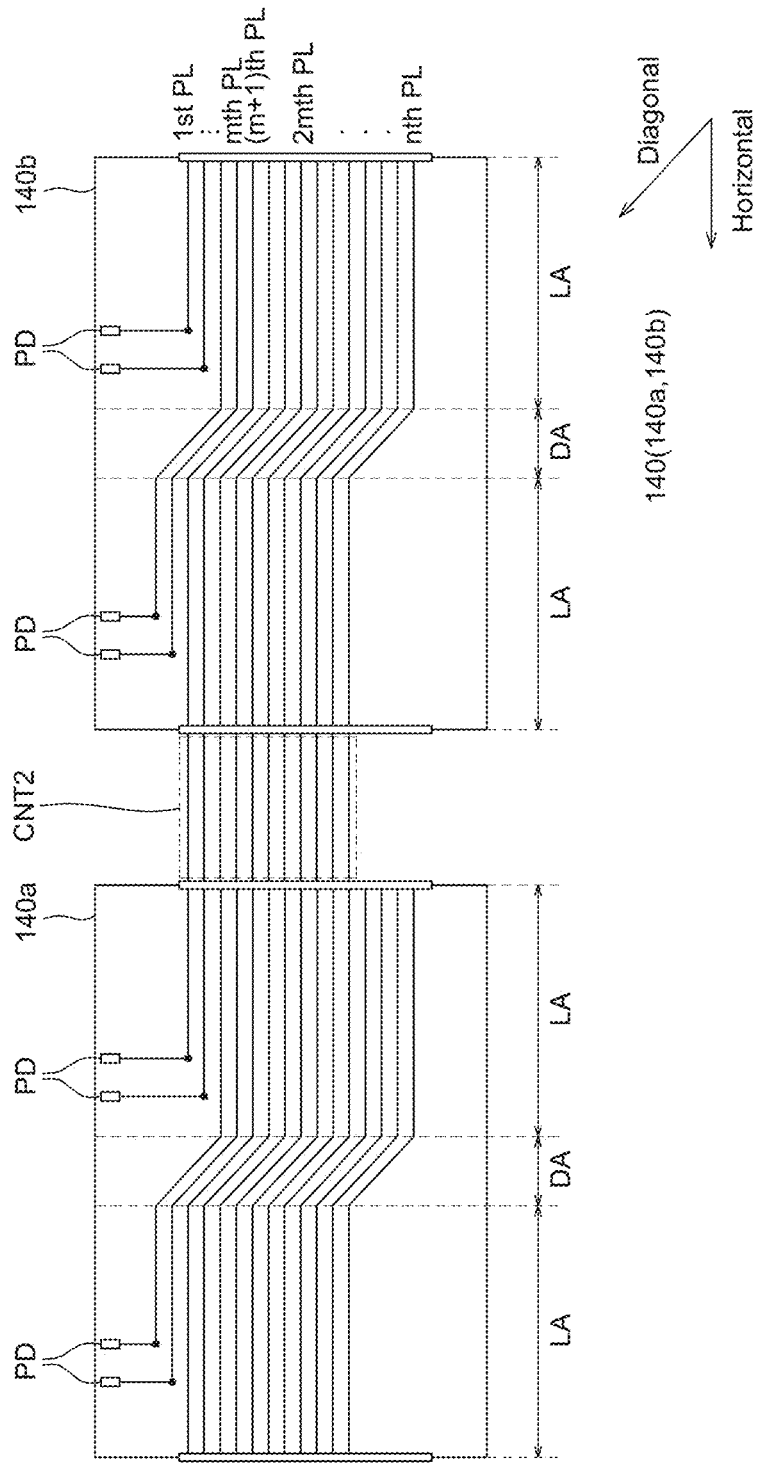
FIG. 4 is a top view illustrating a connection relationship between a plurality of printed circuit boards of the tiling display device according to an exemplary embodiment of the present disclosure.

FIG. 4 is a top view illustrating a connection relationship between a plurality of printed circuit boards of the tiling display device according to an exemplary embodiment of the present disclosure.

As illustrated in FIG. 4, a first printed line 1st PL to an n-th printed line n-th PL are disposed on the printed circuit boards 140. In addition, a plurality of pads PD are connected to each of the first printed line 1st PL to an m-th printed line m-th PL among the first printed line 1st PL to the n-th printed line n-th PL. In addition, each of the plurality of pads PD is connected to each of the one or more flexible films 130. Here, n may be a natural number of 2 or more, and m may be a natural number of n or less.

For example, in FIG. 4, when n is 16 and m is 4, two adjacent printed circuit boards 140a, 140b, are illustrated. Specifically, on each of the printed circuit boards 140, each of the first to fourth printed lines 1st PL to 4th PL is connected to each of four pads PD, and the four pads PD are respectively, electrically connected to the four flexible films 130.

All of the plurality of printed circuit boards 140 may have the same shape. That is, shapes of the printed lines PL that are disposed on the plurality of printed circuit boards 140 may be the same as each other.

Specifically, each of the plurality of printed circuit boards 140 may be divided into a linear area LA in which each of the first printed line 1st PL to the n-th printed line n-th PL extends in a linear direction (horizontal direction), and a diagonal area DA in which each of the first printed line 1st PL to the n-th printed line n-th PL extends in a diagonal direction.

For example, in FIG. 4, it is illustrated that the diagonal area DA is disposed between two linear areas LA, but is not limited thereto, and an arrangement position of the diagonal area DA may be variously changed.

In FIG. 4, the first printed line 1st PL and a second printed line 2nd PL are illustrated to be disposed only in the linear area LA, but are not limited thereto, and the first printed line 1st PL and the second printed line 2nd PL may also extend variously to the diagonal area DA.

The first printed line 1st PL to the m-th printed line m-th PL of a first printed circuit board 140a may be respectively connected to an (m+1)th printed line (m+1)th PL to a 2m-th printed line 2m-th PL of a second printed circuit board 140b through a plurality of the second connection lines CNT2. The plurality of second connection lines CNT2 may extend in the linear direction (horizontal direction). The first printed circuit board 140a and the second printed circuit board 140b described above are adjacent to each other, and the first printed circuit board 140a refers to the printed circuit board 140 disposed on a left side of the plurality of second connection lines CNT2 and the second printed circuit board 140b refers to the printed circuit board 140 disposed on a right side of the plurality of second connection lines CNT2, in FIG. 4.

For example, in FIG. 4, the first printed line 1st PL of the first printed circuit board 140a is electrically connected to a fifth printed line 5th PL of the second printed circuit board 140b through the second connection line CNT2, the second printed line 2nd PL of the first printed circuit board 140a is electrically connected to a sixth printed line 6th PL of the second printed circuit board 140b through the second connection line CNT2, a third printed line 3rd PL of the first printed circuit board 140a is electrically connected to a seventh printed line 7th PL of the second printed circuit board 140b through the second connection line CNT2, and a fourth printed line 4th PL of the first printed circuit board 140a is electrically connected to an eighth printed line 8th PL of the second printed circuit board 140b through the second connection line CNT2.

Figure 5:
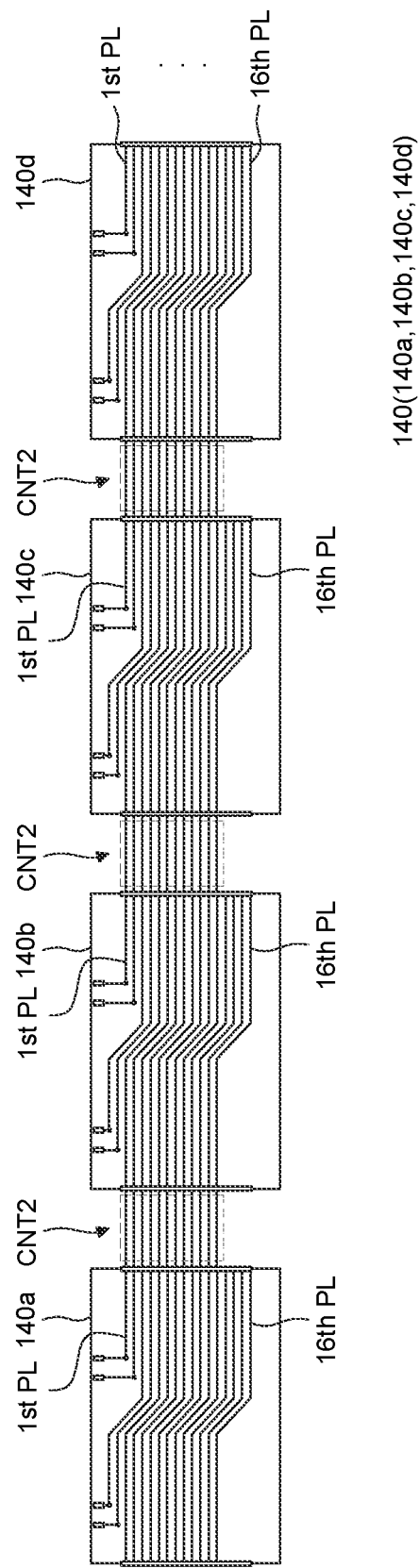
FIG. 5 is a top view illustrating a connection relationship between four printed circuit boards of the tiling display device according to an exemplary embodiment of the present disclosure.

FIG. 5 is a top view illustrating a connection relationship between four printed circuit boards 140 of the tiling display device according to an exemplary embodiment of the present disclosure.

In FIG. 5, a concrete connection relationship between printed lines PL is illustrated when the printed circuit boards 140 are four printed circuit boards. Specifically, a first printed circuit board 140a, a second printed circuit board 140b, a third printed circuit board 140c, and a fourth printed circuit board 140d are sequentially disposed. Further, although not illustrated in FIG. 5, the fourth printed circuit board 140d is electrically connected to a main circuit board CB through a first connection line CNT1. That is, a first printed line 1st PL to a sixteenth printed line 16th PL of the fourth printed circuit board 140d are connected to the main circuit board CB.

In the first printed circuit board 140a, a connection relationship between a first printed line 1st PL to a fourth printed line 4th PL that are connected to the flexible films 130 will be described as follows.

The first printed line 1st PL of the first printed circuit board 140a is connected to a fifth printed line 5th PL of the second printed circuit board 140b, a ninth printed line 9th PL of the third printed circuit board 140c, and a thirteenth printed line 13th PL of the fourth printed circuit board 140d through a plurality of second connection lines CNT2. A second printed line 2nd PL of the first printed circuit board 140a is connected to a sixth printed line 6th PL of the second printed circuit board 140b, a tenth printed line 10th PL of the third printed circuit board 140c, and a fourteen printed line 14th PL of the fourth printed circuit board 140d through the plurality of second connection lines CNT2. A third printed line 3rd PL of the first printed circuit board 140a is connected to a seventh printed line 7th PL of the second printed circuit board 140b, an eleventh printed line 11th PL of the third printed circuit board 140c, and a fifteenth printed line 15th PL of the fourth printed circuit board 140d through the plurality of second connection lines CNT2. The fourth printed line 4th PL of the first printed circuit board 140a is connected to an eighth printed line 8th PL of the second printed circuit board 140b, a twelfth printed line 12th PL of the third printed circuit board 140c, and a sixteenth printed line 16th PL of the fourth printed circuit board 140d through the plurality of second connection lines CNT2.

In the second printed circuit board 140b, a connection relationship between a first printed line 1st PL to a fourth printed line 4th PL that are connected to the flexible films 130 will be described as follows. The first printed line 1st PL of the second printed circuit board 140b is connected to a fifth printed line 5th PL of the third printed circuit board 140c and a ninth printed line 9th PL of the fourth printed circuit board 140d through the plurality of second connecting lines CNT2. A second printed line 2nd PL of the second printed circuit board 140b is connected to a sixth printed line 6th PL of the third printed circuit board 140c and a tenth printed line 10th PL of the fourth printed circuit board 140d through the plurality of second connection lines CNT2. A third printed line 3rd PL of the second printed circuit board 140b is connected to a seventh printed line 7th PL of the third printed circuit board 140c and an eleventh printed line 11th PL of the fourth printed circuit board 140d through the plurality of second connection lines CNT2. A fourth printed line 4th PL of the second printed circuit board 140b is connected to an eighth printed line 8th PL of the third printed circuit board 140c and a twelfth printed line 12th PL of the fourth printed circuit board 140d through the plurality of second connection lines CNT2.

In the third printed circuit board 140c, a connection relationship between a first printed line 1st PL to a fourth printed line 4th PL that are connected to the flexible film 130 will be described as follows. The first printed line 1st PL of the third printed circuit board 140c is connected to a fifth printed line 5th PL of the fourth printed circuit board 140d through the plurality of second connection lines CNT2. A second printed line 2nd PL of the third printed circuit board 140c is connected to a sixth printed line 6th PL of the fourth printed circuit board 140d through the plurality of second connection lines CNT2. A third printed line 3rd PL of the third printed circuit board 140c is connected to a seventh printed line 7th PL of the fourth printed circuit board 140d through the plurality of second connection lines CNT2. The fourth printed line 4th PL of the third printed circuit board 140c is connected to an eighth printed line 8th PL of the fourth printed circuit board 140d through the plurality of second connection lines CNT2.

Accordingly, in the first printed circuit board 140a, the second printed circuit board 140b, and the third printed circuit board 140c, the first printed lines 1st PL to the fourth printed lines 4th PL that are connected to the flexible films 130 are respectively connected to the fifth printed line 5th PL to the sixteenth printed line 16th PL of the fourth printed circuit board 140d. The first printed line 1st PL to the sixteenth printed line 16th PL of the fourth printed circuit board 140d are connected to the main circuit board CB.

Accordingly, all of the flexible films 130 may be connected to the main circuit board CB via one or more printed circuit boards 140, so that all the flexible films 130 may receive various signals such as a driving signal and/or a data signal to thereby allow all of the display panels to be driven.

For example, in a case in which a tiling display device includes a plurality of printed circuit boards differently formed according to positions of a plurality of display devices, the printed circuit boards need to be separately formed according to the positions of the plurality of display devices in order to manufacture the tiling display device. When assembling the tiling display device, there is an inconvenience of accurately grasping the respective positions of the plurality of display devices and disposing the plurality of display devices to match the respective positions of the plurality of display devices.

However, the tiling display device TD according to an exemplary embodiment of the present disclosure may include the plurality of printed circuit boards 140 having the same shape. Accordingly, in the tiling display device according to an exemplary embodiment of the present disclosure, printed circuit boards having the same shape may be formed and used in common without the need to separately form printed circuit boards according to positions of the plurality of display devices. Accordingly, the tiling display device according to an exemplary embodiment of the present disclosure may allow for improvements in the efficiency of a manufacturing process of printed circuit boards. Even when assembling the tiling display device according to an exemplary embodiment of the present disclosure, a plurality of display devices may be disposed regardless of positions of the plurality of display devices. Accordingly, the tiling display device according to an exemplary embodiment of the present disclosure may also allow for improvements in the yield of a module assembly process.

Hereinafter, a tiling display device according to another exemplary embodiment of the present disclosure will be described in detail. In another exemplary embodiment of the present disclosure, printed circuit boards and second connection lines have different shapes from those in an exemplary embodiment of the present disclosure. Accordingly, overlapping contents of an exemplary embodiment of the present disclosure and another exemplary embodiment of the present disclosure will be omitted, and the shapes of the printed circuit board and the second connection line will be described in detail.

Figure 6:
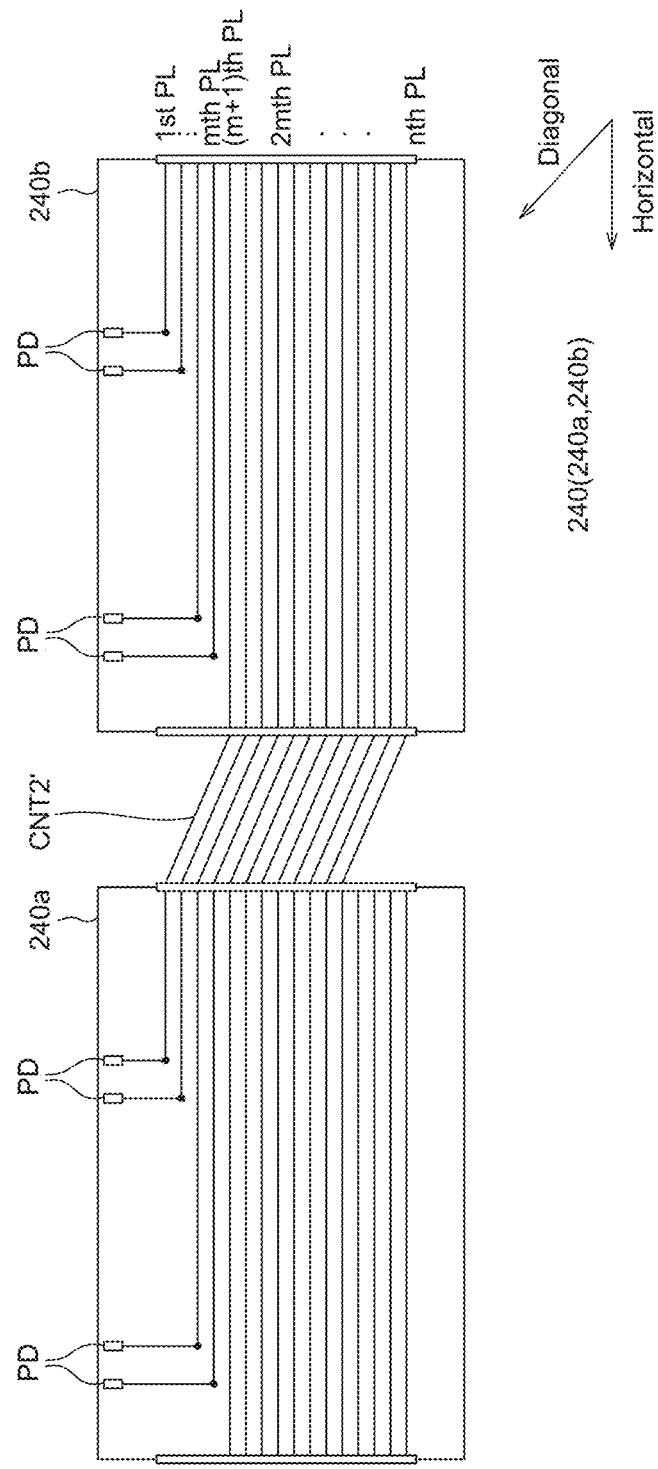
FIG. 6 is a top view illustrating a connection relationship between a plurality of printed circuit boards of a tiling display device according to another exemplary embodiment of the present disclosure.

Another Exemplary Embodiment of the Present Disclosure—Different Shape of Printed Circuit Boards FIG. 6 is a top view illustrating a connection relationship between a plurality of printed circuit boards of a tiling display device according to another exemplary embodiment of the present disclosure.

As illustrated in FIG. 6, in the tiling display device according to another exemplary embodiment of the present disclosure, all of a plurality of printed circuit boards 240 may have the same shape. That is, shapes of the printed lines PL disposed on the plurality of printed circuit boards 240 may be the same.

Specifically, in each of the plurality of printed circuit boards 240, each of a first printed line 1st PL to an n-th printed line n-th PL may extend in a horizontal direction.

The first printed line 1st PL to an m-th printed line m-th PL of a first printed circuit board 240a may be respectively connected to an (m+1)th printed line (m+1)th PL to a 2m-th printed line 2m-th PL of a second printed circuit board 240b through a plurality of second connection lines CNT2'. The plurality of second connection lines CNT2' may extend in a diagonal direction (inclined direction). The first printed circuit board 240a and the second printed circuit board 240b described above are adjacent to each other, and the first printed circuit board 240a refers to the printed circuit board 240 disposed on a left side of the plurality of second connection lines CNT2' and the second printed circuit board 240b refers to the printed circuit board 240 disposed on a right side of the plurality of second connection lines CNT2'.

For example, in FIG. 6, the first printed line 1st PL of the first printed circuit board 240a is electrically connected to a fifth printed line 5th PL of the second printed circuit board 240b through the second connection line CNT2', a second printed line 2nd PL of the first printed circuit board 240a is electrically connected to a sixth printed line 6th PL of the second printed circuit board 240b through the second connecting line CNT2', a third printed line 3rd PL of the first printed circuit board 240a is electrically connected to a seventh printed line 7th PL of the second printed circuit board 240b through the second connecting line CNT2', and a fourth printed line 4th PL of the first printed circuit board 240a is electrically connected to an eighth printed line 8th PL of the second printed circuit board 240b through the second connecting line CNT2'.

That is, in the tiling display device according to another exemplary embodiment of the present disclosure, since each of the first printed line 1st PL to the n-th printed line n-th PL extends in the linear direction (horizontal direction), the first printed line 1st PL to the m-th printed line m-th PL of the first printed circuit board 240a may not be horizontally aligned with the (m+1)th printed line (m+1)th PL to the 2m-th printed line 2m-th PL of the second printed circuit board 240b, respectively.

Accordingly, in the tiling display device according to another exemplary embodiment of the present disclosure, the second connection lines CNT2' needs to extend in a diagonal direction so as to connect the first printed line 1st PL to the m-th printed line m-th PL of the first printed circuit board 240a and the (m+1)th printed line (m+1)th PL to the 2m-th printed line 2m-th PL of the second printed circuit board 240b, respectively.

The tiling display device according to another exemplary embodiment of the present disclosure may also include the plurality of printed circuit boards having the same shape, and in each of the plurality of printed circuit boards 240, each of the first printed line 1st PL to the n-th printed line n-th PL may extend in the linear direction (horizontal direction). Accordingly, in the tiling display device according to another exemplary embodiment of the present disclosure, printed circuit boards having the same shape may be formed and used in common. Furthermore, in the tiling display device according to another exemplary embodiment of the present disclosure, by forming more simplified printed lines, it is possible to further improve the efficiency of a manufacturing process of printed circuit boards. The tiling display device according to another exemplary embodiment of the present disclosure may also allow for improvements in the yield of the module assembly process.

Hereinafter, a tiling display device according to still another exemplary embodiment of the present disclosure will be described in detail. In still another exemplary embodiment of the present disclosure, there is a technical difference in terms of a compensation printed circuit, compared to an exemplary embodiment and another exemplary embodiment of the present disclosure. Accordingly, overlapping contents of still another exemplary embodiment of the present disclosure and an exemplary embodiment and another exemplary embodiment of the present disclosure will be omitted, and the compensation printed circuit will be described in detail.

Figure 7A:
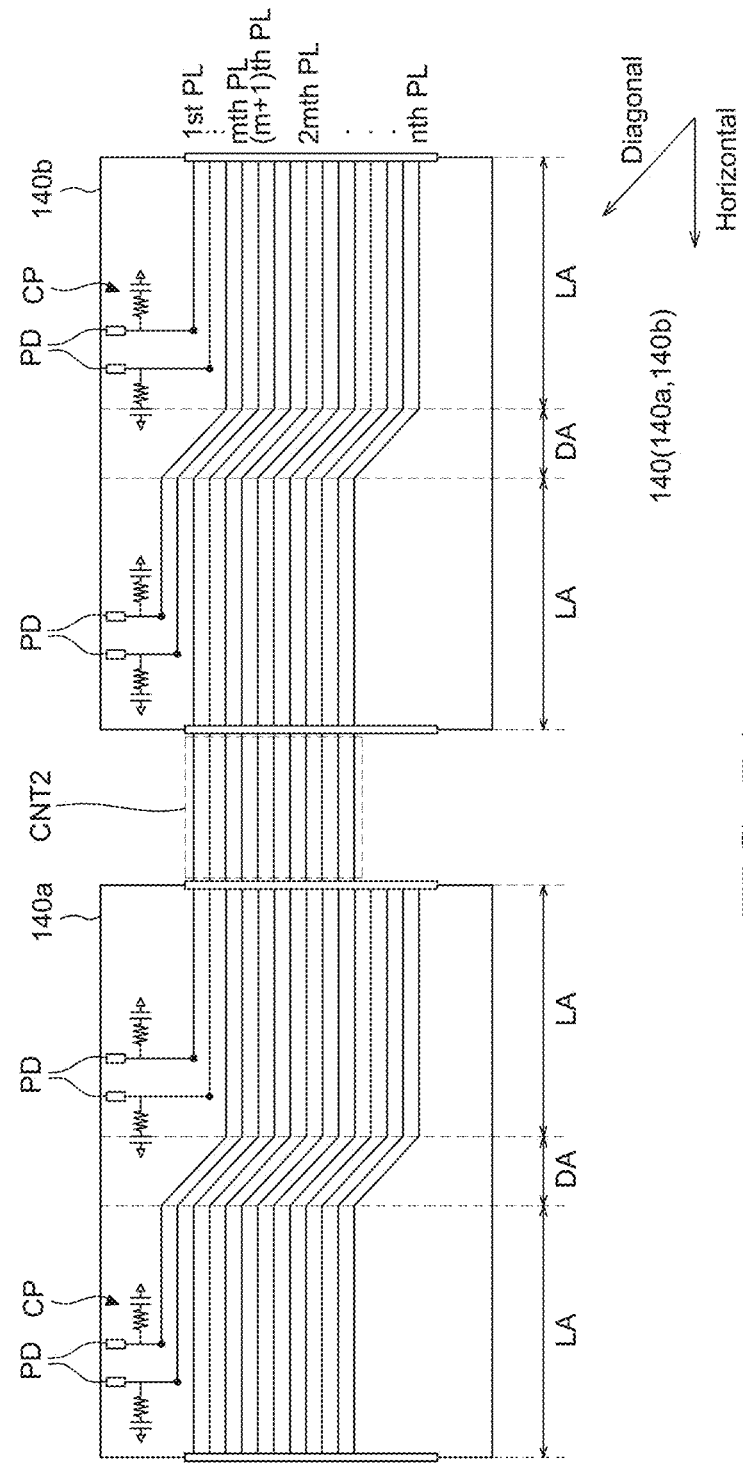
FIG. 7A and FIG. 7B are top views illustrating a connection relationship between a plurality of printed circuit boards of a tiling display device according to still another exemplary embodiment of the present disclosure.
Figure 7B:
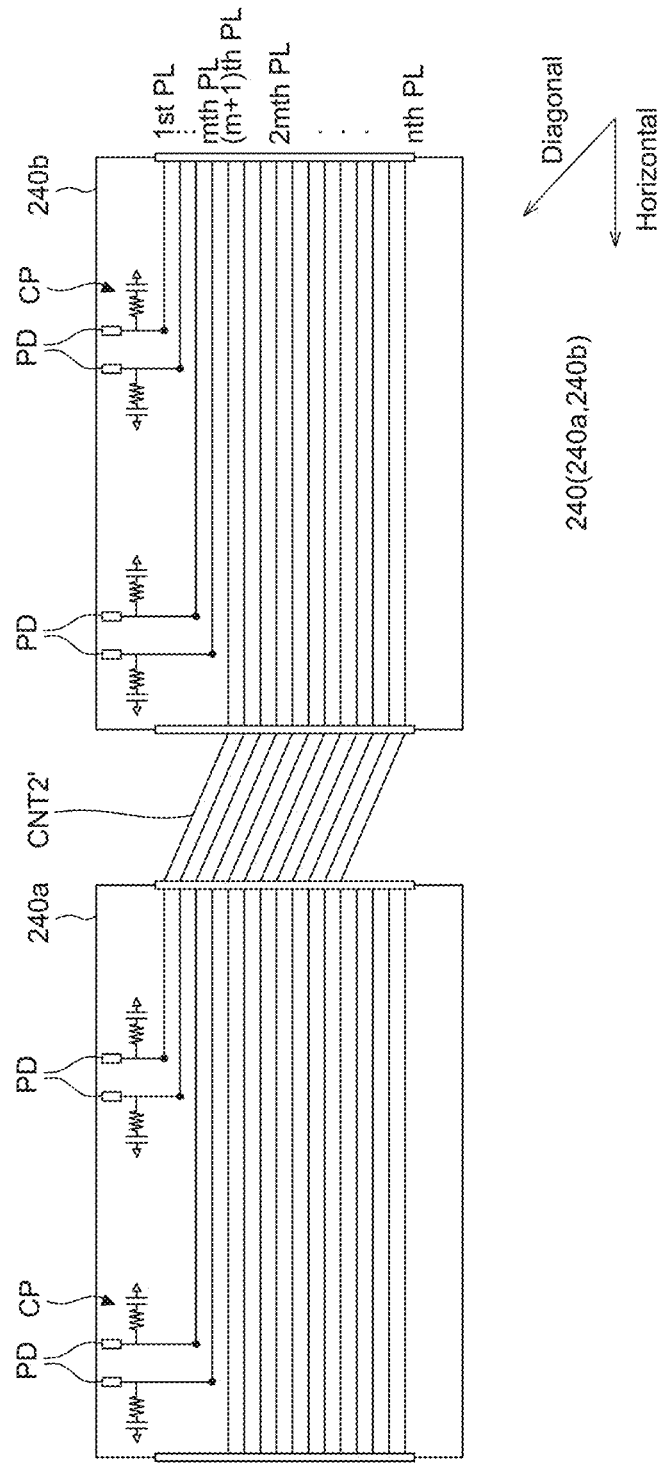
Figure 8:
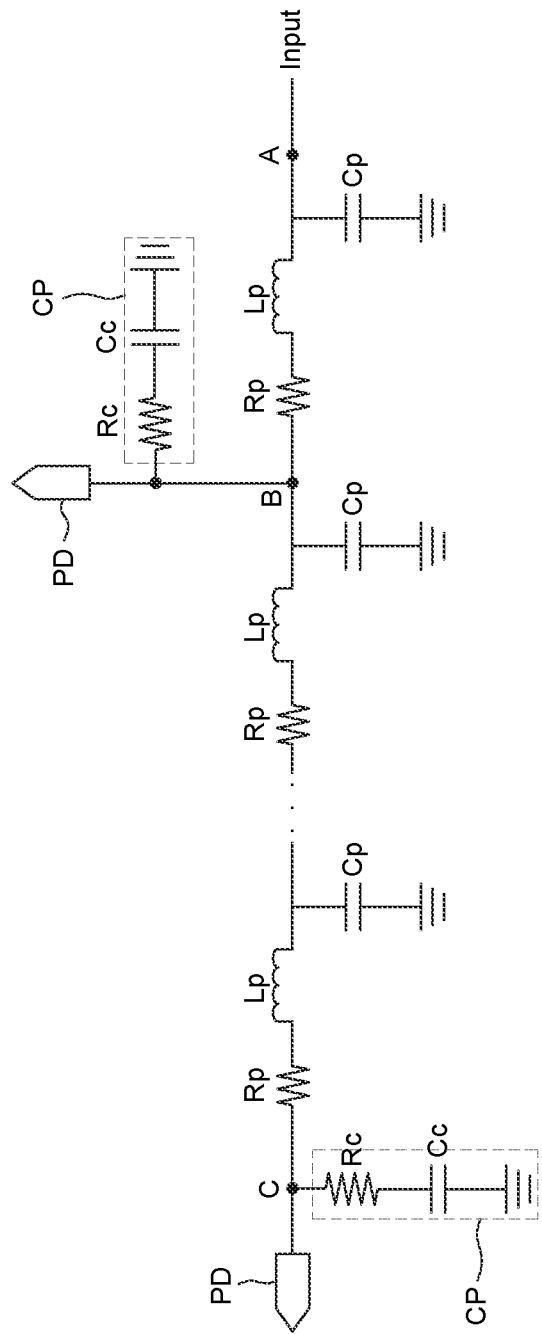
FIG. 8 is an equivalent circuit diagram of a compensation printed circuit of a tiling display device according to still another exemplary embodiment of the present disclosure.
Figure 9A:
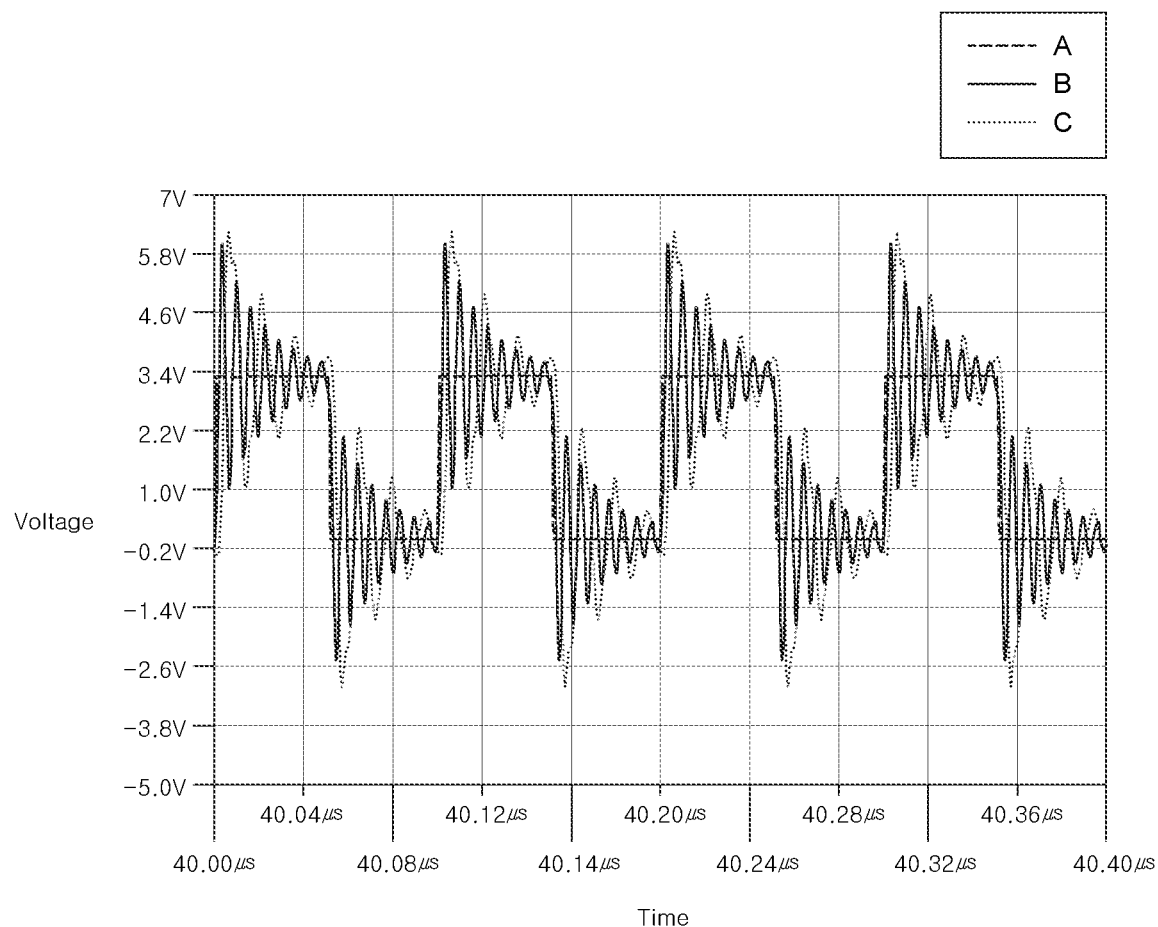
FIG. 9A is a waveform diagram illustrating an output signal from a printed circuit board of a tiling display device according to a comparative example.
Figure 9B:
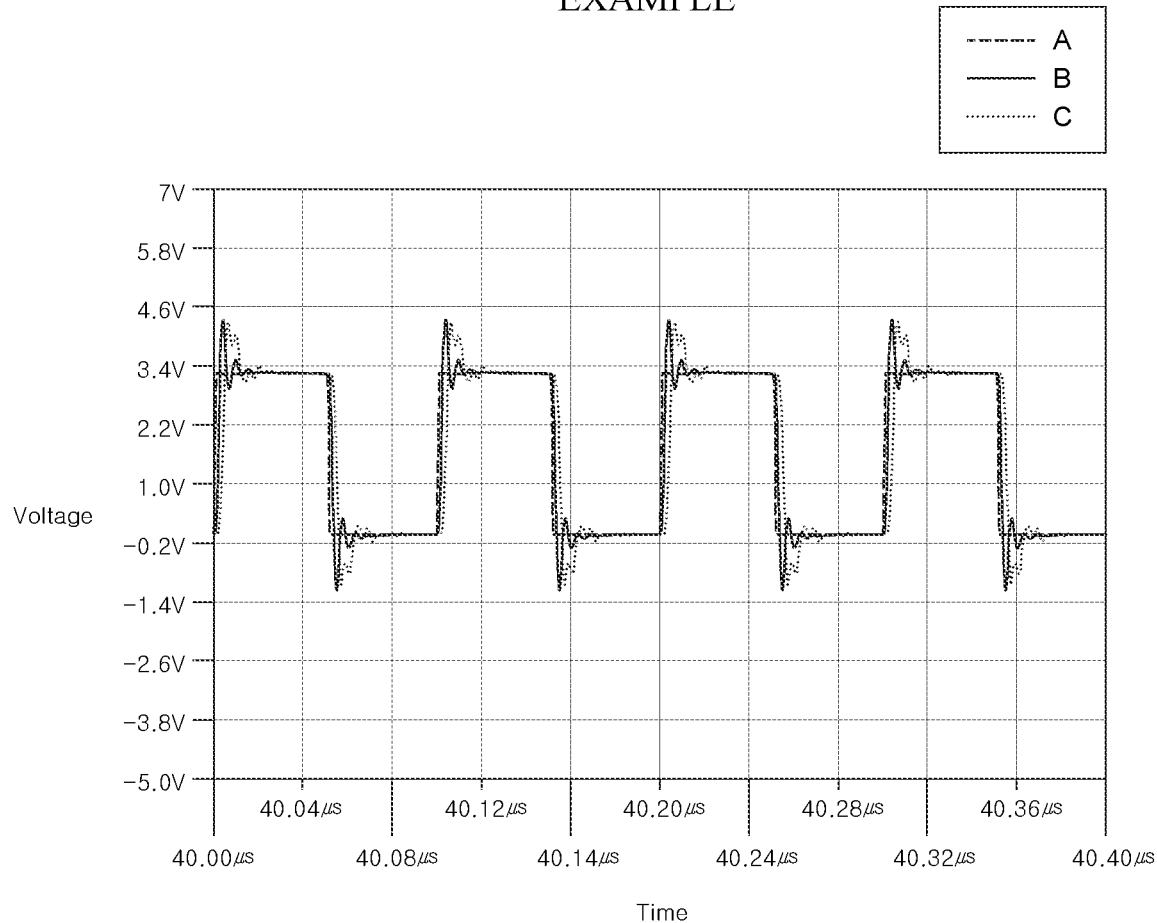
FIG. 9B is a waveform diagram illustrating an output signal of a printed circuit board of a tiling display device according to still another exemplary embodiment of the present disclosure.

Still Another Exemplary Embodiment of the Present Disclosure—Compensation Printed Circuit FIG. 7A and FIG. 7B are top views illustrating a connection relationship between a plurality of printed circuit boards of a tiling display device according to still another exemplary embodiment of the present disclosure. FIG. 8 is an equivalent circuit diagram of a compensation printed circuit of a tiling display device according to still another exemplary embodiment of the present disclosure. FIG. 9A is a waveform diagram illustrating an output signal from a printed circuit board of a tiling display device according to a comparative example. FIG. 9B is a waveform diagram illustrating an output signal of a printed circuit board of a tiling display device according to still another exemplary embodiment of the present disclosure.

Specifically, FIG. 7A shows that a compensation printed circuit CP is added to the printed circuit board 140 of the tiling display device according to an exemplary embodiment of the present disclosure, and FIG. 7B shows that a compensation printed circuit CP is added to the printed circuit board 240 of the tiling display device according to another embodiment of the present disclosure.

As illustrated in FIGS. 7A and 7B, in each of the plurality of printed circuit boards 140 and 240, the compensation printed circuit CP is connected to the first printed line 1st PL to the m-th printed line m-th PL to which the flexible film 130 is connected. Specifically, the compensation printed circuit CP is connected to one ends of the first printed line 1st PL to the m-th printed line m-th PL so as to be adjacent to each of the plurality of pads PD.

The compensation printed circuit CP may be a circuit in which a compensation resistor Rc and a compensation capacitor Cc are connected in series.

As illustrated in FIG. 8, a parasitic resistor Rp, a parasitic inductor Lp, and a parasitic capacitor Cp may be generated in each of the plurality of printed circuit boards 140. Since the plurality of printed circuit boards 140 are cascaded, the parasitic resistors Rp, the parasitic inductors Lp, and the parasitic capacitors Cp formed in the printed circuit boards 140 may be connected in series.

Accordingly, when the compensation printed circuit CP was not formed in the printed circuit board 140, noise was generated compared to an input signal, like the output signal of the comparative example illustrated in FIG. 9A.

Specifically, as illustrated in FIGS. 8 and 9A, an input signal may be directly applied to a node A without the influence of the parasitic resistor Rp, the parasitic inductor Lp, and the parasitic capacitor Cp. A node B is affected by the parasitic resistor Rp, parasitic inductor Lp, and parasitic capacitor Cp of one printed circuit board and thus, an output signal measured at the node B may have a relatively small amount of noise compared to the input signal. A node C is affected by the parasitic resistors Rp, the parasitic inductors Lp, and the parasitic capacitors Cp of the plurality of printed circuit boards, and thus, an output signal measured at the node C may have a relatively large amount of noise compared to the input signal.

On the other hand, in the tiling display device according to still another exemplary embodiment of the present disclosure, a compensation printed circuit Cp in which a compensation resistor Rc and a compensation capacitor Cc are connected in series is added to the first printed line 1st PL to the m-th printed line m-th PL to which the flexible film 130 is connected.

Specifically, a capacitance value of the compensation capacitor Cc may be capacitance of the parasitic capacitor $Cp \times (1/(k^2-1))$, and a resistance value of the compensation resistor Rc may be (inductance of the parasitic inductor Lp/capacitance of the parasitic capacitor $Cp)^{1/2}$. The above-described k is a natural number and means a multiple of a fundamental resonance frequency.

Accordingly, by adding a compensation printed circuit CP in which the compensation resistor Rc and the compensation capacitor Cc are connected in series to the tiling display device according to still another exemplary embodiment of the present disclosure, noise of an output signal can be remarkably reduced like the output signal of still another exemplary embodiment of the present disclosure illustrated in FIG. 9B.

Specifically, as illustrated in FIGS. 8 and 9B, an input signal may be directly applied to a node A without the influence of the parasitic resistor Rp, the parasitic inductor Lp, and the parasitic capacitor Cp. A node B is affected by the parasitic resistor Rp, the parasitic inductor Lp and the parasitic capacitor Cp of one printed circuit board, but by the compensation printed circuit connected to the node B, noise of an output signal measured at the pad PD connected to the node B may be reduced to no more than 1V. A node C is affected by the parasitic resistor Rp, the parasitic inductor Lp, and the parasitic capacitor Cp of the plurality of printed circuit boards, but by the compensation printed circuit connected to the node C, noise of an output signal measured at the pad PD connected to the node C may be reduced to no more than 1V.

The exemplary embodiments of the present disclosure can also be described as follows:

According to an aspect of the present disclosure, a tiling display device comprises a plurality of display devices, and a main circuit board driving the plurality of display devices. Each of the plurality of display devices includes a display panel that implements an image, a plurality of flexible films bonded to a rear surface of the display panel, and a printed circuit board electrically connected to the plurality of flexible films. A plurality of printed circuit boards of the plurality of display devices are cascaded to each other, and the plurality of printed circuit boards have the same shape. Therefore, the efficiency of a manufacturing process of the plurality of printed circuit boards provided in a tiling display device can be improved.

The tiling display device may further comprise a plurality of first connection lines connecting the main circuit board and the plurality of printed circuit boards, and a plurality of second connection lines connecting the plurality of printed circuit boards.

A first printed line to an n-th printed line may be disposed on each of the plurality of printed circuit boards, where n is a natural number of 2 or more. And the first printed line to an m-th printed line may be respectively connected to the one or more flexible films through a plurality of pads, where m is a natural number less than or equal to n.

The first printed line to the m-th printed line of a first printed circuit board may be respectively connected to a (m+1)th printed line to a 2m-th printed line of a second printed circuit board adjacent to the first printed circuit board.

Each of the plurality of printed circuit boards may be divided into a linear area in which each of the first printed line to the n-th printed line extends in a linear direction, and a diagonal area in which each of the first printed line to the n-th printed line extends in a diagonal direction.

Each of the plurality of second connection lines may extend in a linear direction.

Each of the first printed line to the n-th printed line may extend in a linear direction.

Each of the plurality of second connection lines may extend in a diagonal direction.

A compensation printed circuit may be connected to each of the first printed line to the m-th printed line.

The compensation printed circuit may include a compensation resistor and a compensation capacitor that are connected in series.

A capacitance value of the compensation capacitor may be (parasitic capacitance)×(1/(k²−1)), and a resistance value of the compensation resistor is (parasitic inductance/parasitic capacitance)$^{1/2}$, where k is a natural number.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A tiling display device, comprising:
a plurality of display devices; and
a main circuit board driving the plurality of display devices,
wherein each of the plurality of display devices includes,
a display panel that displays an image;
one or more flexible films bonded to a rear surface of the display panel; and
a printed circuit board electrically connected to the one or more flexible films,
wherein a plurality of printed circuit boards of the plurality of display devices are cascaded to each other,
wherein the plurality of printed circuit boards have a same shape,
wherein a first printed line to an n-th printed line are disposed on each of the plurality of printed circuit boards, where n is a natural number of 2 or more, and
wherein the first printed line to an m-th printed line of a first printed circuit board are respectively connected to a (m+1)th printed line to a 2m-th printed line of a second printed circuit board adjacent to the first printed circuit board, where m is a natural number less than n or equal to n, and
wherein the display panel includes a micro-light emitting diode (LED), the micro-LED including an n-type semiconductor layer, a p-type semiconductor layer, and a light emitting layer.

2. The tiling display device of claim 1, further comprising:
a plurality of first connection lines connecting the main circuit board to the plurality of printed circuit boards, and
a plurality of second connection lines connecting the plurality of printed circuit boards.

3. The tiling display device of claim 2,
wherein a first printed line to an n-th printed line are disposed on each of the plurality of printed circuit boards, where n is a natural number of 2 or more,
wherein the first printed line to an m-th printed line are respectively connected to the one or more flexible films through a plurality of pads, where m is a natural number less than or equal to n.

4. The tiling display device of claim 3,
wherein the first printed line to the m-th printed line of a first printed circuit board are respectively connected to a (m+1)th printed line to a 2m-th printed line of a second printed circuit board adjacent to the first printed circuit board.

5. The tiling display device of claim 3, wherein each of the plurality of printed circuit boards comprises:
a first linear area including a first portion of a plurality of printed lines that extend in a linear direction that is parallel to a side of the printed circuit board;
a diagonal area including a second portion of the plurality of printed lines that extend from the first portion of the plurality of printed lines in the first linear area, and the second portion of the plurality of printed lines extending in a diagonal direction that intersects the linear direction; and
a second linear area including a third portion of the plurality of printed lines that extend from the second portion of the plurality of printed lines in the diagonal area, and the third portion of the plurality of printed lines extending in the linear direction,
wherein the diagonal area is between the first linear area and the second linear area.

6. The tiling display device of claim 5,
wherein each of the plurality of second connection lines extends in the linear direction.

7. The tiling display device of claim 3,
wherein each of the first printed line to the n-th printed line extends in a linear direction that is parallel to a side of at least one of the plurality of printed circuit boards.

8. The tiling display device of claim 7,
wherein the plurality of printed circuit boards including a first printed circuit board of a first display device and a second printed circuit board of a second display device adjacent to the first display device,
wherein a plurality of second connection lines between the first printed circuit board and the second printed circuit board, the plurality of second connection lines electrically connecting together first printed lines of the first printed circuit board and second printed lines of the second printed circuit board, the first printed lines and the second printed lines extending in a direction that is parallel to a side of the first printed circuit board and a side of the second printed circuit board,
wherein the plurality of second connection lines extend in a diagonal direction that intersects the direction of first printed lines and the second printed lines,
wherein each of the plurality of second connection lines extends in a diagonal direction that intersects the linear direction.

9. The tiling display device of claim 3,
wherein a compensation printed circuit is connected to each of the first printed line to the m-th printed line.

10. The tiling display device of claim 9,
wherein the compensation printed circuit includes a compensation resistor and a compensation capacitor that are connected in series.

11. The tiling display device of claim 10,
wherein a capacitance value of the compensation capacitor is (parasitic capacitance)$\times(1/(k^2-1))$, and a resistance value of the compensation resistor is (parasitic inductance/parasitic capacitance)$^{1/2}$, where k is a natural number.

12. The tiling display device of claim 1,
wherein each of the plurality of display devices further includes a binding member disposed on the rear surface of the display panel to support and protect the display panel.

* * * * *